United States Patent [19]

Schumacher

[11] 4,227,291
[45] Oct. 14, 1980

[54] ENERGY EFFICIENT PROCESS FOR CONTINUOUS PRODUCTION OF THIN SEMICONDUCTOR FILMS ON METALLIC SUBSTRATES

[75] Inventor: John C. Schumacher, Oceanside, Calif.

[73] Assignee: J. C. Schumacher Co., Oceanside, Calif.

[21] Appl. No.: 918,034

[22] Filed: Jun. 22, 1978

[51] Int. Cl.³ .............................................. B01J 17/00
[52] U.S. Cl. ........................................ 29/572; 29/589; 29/590; 204/14 N; 204/45 R; 204/58; 427/86
[58] Field of Search .................... 29/572, 589, 590; 204/14 N, 45 R, 58; 427/86

[56] References Cited

U.S. PATENT DOCUMENTS

| | | | |
|---|---|---|---|
| 3,211,572 | 10/1965 | Globus | 427/253 |
| 3,990,953 | 11/1976 | Austin | 204/14 N |

*Primary Examiner*—W. C. Tupman
*Attorney, Agent, or Firm*—Knobbe, Martens, Olson, Hubbard & Bear

[57] ABSTRACT

An energy efficient process is disclosed for the continuous production of semiconductor matrices formed from depositing doped silicon or germanium films on metallic sheet substrates. The energy released from such deposition can then be used to regenerate the anode material used in the deposition.

5 Claims, 2 Drawing Figures

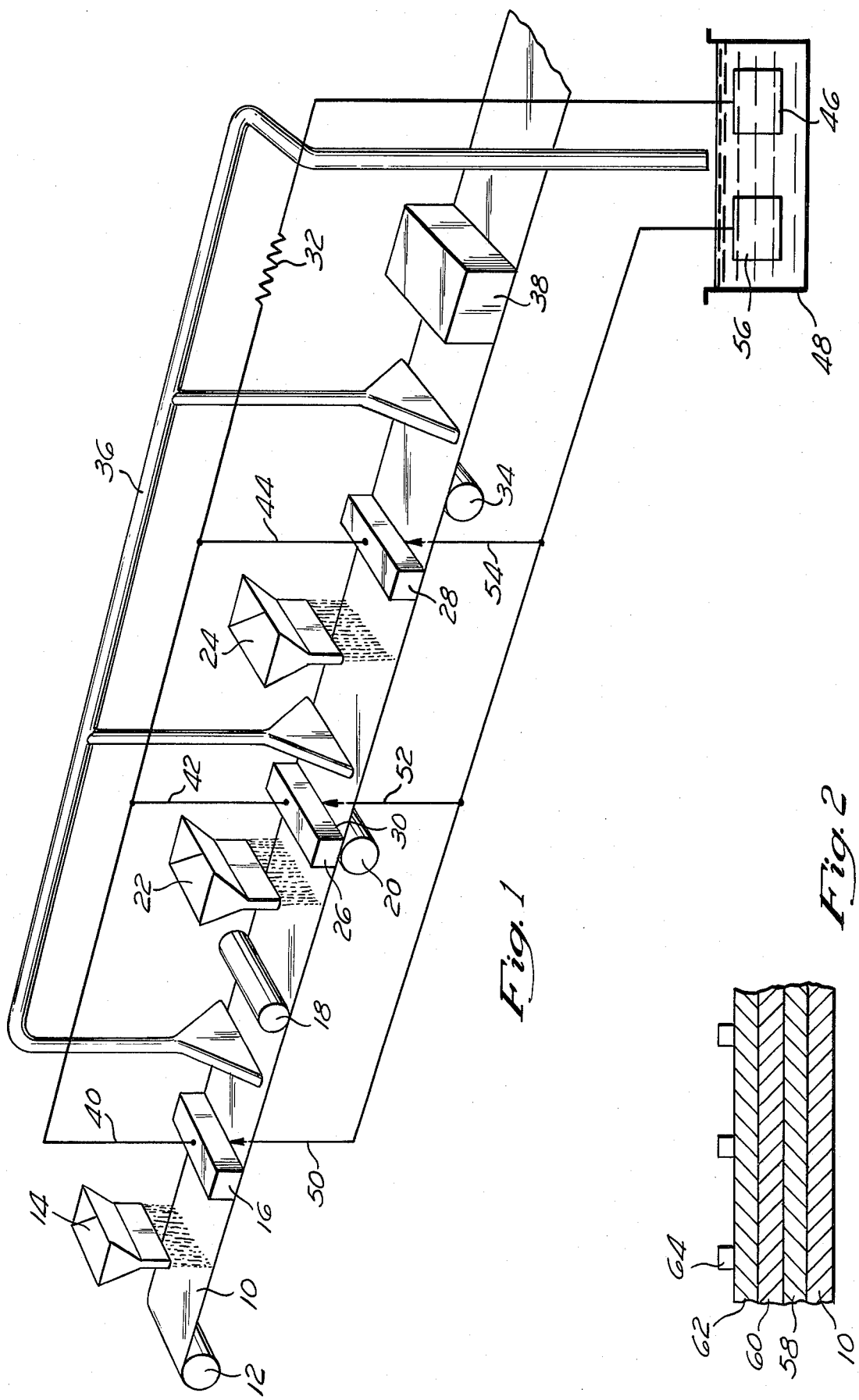

ENERGY EFFICIENT PROCESS FOR CONTINUOUS PRODUCTION OF THIN SEMICONDUCTOR FILMS ON METALLIC SUBSTRATES

BACKGROUND OF THE INVENTION

The present invention relates to semiconductor matrices which can be used in devices such as solar cells, diodes, electrifiers and transistors and the like and to methods of manufacturing such matrices from elemental semiconductors such as silicon and germanium.

An extremely important use of the semiconductor matrices of the present invention is in a solar cell. Because of the rapid depletion of our natural energy sources, and the associated pollution problems with these sources, solar energy as a source of energy has become highly important. Solar energy is abundantly available in this country and can be utilized without ecological problems.

Electricity can be directly generated from solar energy by the photovoltaic process whereby an electric current is generated when light is allowed to fall upon a rectifying contact or junction such as that contained in a solar cell. Photovoltaic solar cells are an expedient means of utilizing the virtually inexhaustable energy resource, incident solar radiation, to meet the growing worldwide demand for electric power.

However, it is well recognized that except in certain specific instances such as satellite space stations or remote installations away from the utility grid, photovoltaic electric generators are not cost effective at this time. This means that a cost penalty will be paid by an end user to employ power from a photovoltaic source compared to utility power derived from non-renewable fossile or nuclear fuels. For example, the costs of production of solar cells for use in satellites is approximately $20 to $50 per watt. This compares quite unfavorably with $0.50 per watt which is the approximately cost for fossile fuels.

A highly desirable objective is therefore to reduce the cost of power generated from solar radiation by the photovoltaic effect to the point where it becomes cost effective, thereby reducing consumption of and dependence upon non-renewable energy resources.

Reducton of cost can occur in any of several operations in the manufacture of photovoltaic solar cells. The disclosed invention focuses upon a method to reduce the cost of fabricating a semiconductor matrix.

An important factor in the cost of the fabrication of the semiconductor matrix is the manner of depositing the elemental semiconductor which is appropriately doped to form p-n junctions, on the substrate. Prior art methods expend and invest much energy in this process step which greatly increases the energy "payback" time of the resulting cells. That is to say, prior art techniques for manufacturing solar cells require the investment of so much energy that it takes several years to have this energy returned (payed back) as electricity from converted solar energy.

An example of this high energy investment in the deposition of silicon is found in Sirtl (U.S. Pat. No. 4,058,418) which discloses depositing silicon by introducing in a hydrogen stream silicon containing gases decomposable at temperatures at about 1,025° C. and 1,200° C. These high temperatures of course require significant energy investment. Carlson (U.S. Pat. No. 4,064,521) discloses a method of deposition as glow discharge which involves the discharge of electricity through gas at a relatively low pressure in a partially evacuated chamber.

Takagi (U.S. Pat. No. 4,066,527) discloses an ionized-cluster-deposition process which again requires significant expenditures of energy.

Janowiecki (U.S. Pat. No. 4,003,770) discloses producing a sprayed junction by plasma spraying a thin layer of silicon of opposite polarity or type over the initially deposited doped film.

Wakefield (U.S. Pat. No. 3,998,659) discloses forming a fluidized suspension of semiconductor particles which are maintained at a suitably elevated reaction temperature. A semiconductor containing vapor together with a dopant vapor and a vaporized reduction agent are then introduced into the fluidized suspension to effect deposition.

Other conventional techniques disclosed in Fang (U.S. Pat. No. 3,914,856) and Chu (U.S. Pat. No. 4,077,818) are epitaxial vaporation, electron beam evaporation, ion sputtering, thermal decomposition of silane, reduction of trichlorosilane or silicon tetrachloride with hydrogen at temperatures arranging from 900° C. to 1,200° C., or by thermal decomposition of dichlorosilane.

The Austin U.S. Pat. No. 3,990,953 discloses a method for electrodepositing elemental silicon on an electrically conductive cathode body. The patented method is an attempt to achieve a pure form of silicon which would subsequently be used in such applications as a solar cell. The electrodeposition occurs in an electroplating glass vessel with anodes and cathodes of platinum. A power supply is then used to drive the reaction to plate out elemental silicon on the cathode body.

The present invention discloses a method of producing semiconductor matrices by depositing the elemental semiconductor material while greatly reducing the cost and the energy investment required.

SUMMARY OF THE INVENTION

The principal object of the present invention is fabrication of an elemental semiconductor matrix, with back side electrode structural support and p-n junction assemblage in a continuous large area sheet form with the absolute minimum energy investment. One embodiment of the invention is the use of this semiconductor matrix in a photovoltaic solar cell.

The invention represents the first semiconductor device ever created in which the energy consumed in producing the semiconductor layer, in placing the rear electrode, and bonding this assemblage to a metallic structural support is an absolute minimum. The process is also continuous with a product size limited only by available metal rolling mill capacity. This gives the added benefit of eliminating the majority of cell interconnections found in the prior art.

In the practice of the invention a continuous substrate is coated with an appropriate electrical contact which is then coated with a thin film of liquid silicon or germanium containing electrolyte which is in turn contacted with an appropriate metal anode to cause elemental silicon or germanium to be deposited (plated out) on the continuous backing strip.

One exceptionally important embodiment of the invention uses an alkali metal as the anode material. U.S. Pat. No. 3,791,871 issued to L. Rowley teaches the manufacture of a consumable anode alkali metal battery often called the Geisler cell. Although working in an entirely different field and for different purposes than the present invention, Rowley and his co-workers developed a technique of reacting an alkali metal with water to produce electricity without an explosion as would normally be expected with these reactants because of the very high exothemicity of the chemical reactions involved, i.e. approximately 35 kilocalories per mole.

The principle by which the potentially explosive combination of an alkali metal with water is allowed to occur in a controlled and useful fashion is the build-up on the electrode being consumed of a film of reaction products which cause access of the reactants to one another to be diffusion controlled. When the alkali metal, for example sodium, touches water, it is converted to an NaOH, $Na_xO_y$ film mixture through which additional OH ions must diffuse to continue their reaction. The rate of diffusion therefore controls the reaction rate. The diffusion of OH ions in turn is controlled by their diffusivity, concentration, and the film thickness, ionic diffusivity in this case obviously including electric field effects.

The overall highly exothermic and kinetically rapid chemical reaction is as follows: $Na(s) + H_2O \rightarrow NaOH + \frac{1}{2}H_2$ $\Delta G_{298}° = -35$ kcal.

The present invention utilizes a highly exothermic alkali metal chemical reaction, with a silicon or germanium compound to produce plating at the cathode as a primary product. An extremely important feature of the disclosed invention is the utilization of the by-product electric power produced through the exothermic alkali metal reaction for direct regeneration of the anode material. In this way a semiconductor matrix is fabricated with a total energy input savings, thus far unattainable by prior methods.

A plurality of metal anodes may be used in order to deposit successive layers of appropriately dopsed silicon or germanium. p-n junctions may then be formed by diffusion or ion implantation. The silicon or germanium sheet deposited will be of the amorphous type or may be able to be converted to polycrystalline material by suitable means such as heat treatment.

In the solar cell embodiment, after formation of the p-n junction front contacts are emplaced by thick film paste technology and metallizing sintering heat treatment. The cell is then encapsulated and shipped for use.

The novel features which are believed to be characteristic of the invention, both as to its organization and method of operation, together with further objectives and advantages thereof, will be better understood from the following description considered in connection with the accompanying drawings in which preferred embodiments of the invention are illustrated.

BRIEF DESCRIPTION OF THE DRAWINGS

A detailed description of the invention will be made with the aid of the accompanying drawings wherein:

FIG. 1 is a schematic view of a production line for fabricating a semiconductor matrix;

FIG. 2 is a cross-sectional view of a semiconductor matrix.

DESCRIPTION OF THE PREFERRED EMBODIMENTS

FIG. 1 shows a production line for the manufacture of a semiconductor matrix which could be used for solar cells, diodes, electrifiers, transistors and the like. The line begins with a thin metal sheet 10 of sufficient Young's Modulus and appropriate thickness to support its own weight in a half I Beam or channel-like configuration without excessive elastic deformation over the area of the desired semiconductor matrix and yet sufficient elastic limit to be coiled. The metal sheet is preferably steel or aluminum. This sheet is then continuously fed into the reaction system by a roller 12.

If the substrate strip is steel, it should first be coated with aluminum. This aluminum may conveniently be applied with any of the techniques known to those of ordinary skill in the art. However, preferably an aluminum coating can be applied using the techniques of the present invention. In this embodiment, a hopper 14 containing aluminum trichloride electrolyte is used to apply the electrolyte to the surface of the substrate. The substrate coated with electrolyte is then contacted with an alkali metal anode 16 to deposit a layer of aluminum on the substrate.

Strip 10 is then fed into the reaction system by rollers 18 and 20. The rollers are configured in a manner similar to a rolling mill operated with only sufficient force applied to the work piece to cause transport without plastic deformation although some elastic deformation may occur.

Electrolyte liquid is then applied as a thin liquid film to the strip 10 by suitable means which may include spraying, immersion and the like by methods well-known to those with ordinary skill in the art. A preferred embodiment of the electrolyte application system is shown in FIG. 1 as applicators 22 and 24. These applicators can be quartz or metal hoppers extending across the substrate 10 and having a multitude of capillary holes in their bottom through which the electrolyte drains at a rate controlled by liquid head in the hoppers 22 and 24, and the average capillary diameter in the bottom of said hoppers.

The electrolyte liquid is of the general formula $MH_{4-n}X_n$ wherein M is germanium or silicon, X is a halogen such as Cl, I or Br and n is 1, 2, 3 or 4. The electrolyte therefore includes all silicon and germanium halides including those pseudo halides which contain hydrogen as well. It may also contain an appropriate polar solvent.

The forward motion of substrate 10 spreads electrolyte liquid $MH_{4-n}X_n$ over its width uniformly while interfacial tension which is most pronounced at the edges is used to prevent overflow of the electrolyte liquid from the substrate 10.

The electrolyte draining from hopper 22 is preferably highly doped with an n type dopant. This can be accomplished by mixing a phosphorous compound with the silicon or germanium electrolyte solution. Examples of such mixtures would be $PBr_3$ in $SiBr_4$, $PB_{r}3$ in $GeBr_4$, $PCl_3$ in $SiCl_4$ or $PCl_3$ in $GeCl_4$.

A highly doped layer of silicon or germanium is then plated onto the top of strip 10 by an deposition. Anodes 26 and 28 are metal rods or thick sheets of metal which are as wide as strip 10 and a thick in the direction of substrate motion as it is required to achieve the necessary plating thickness. These metal anodes are preferably composed of an alkali metal such as lithium, sodium or potassium. The metal anode 26 is contacted with the electrolyte film at point 30 thereby initiating a chemical reaction. If the alkali metal is sodium and the electrolyte is a pure silicon halide, the reaction is as follows:

$$nNa + MX_n \rightarrow n\,NaX + M + \Delta G(<<o) \quad (1).$$

NaX is formed as a thin film on the end of anode 26 which is immersed in the electrolyte film. The rate of reaction (1) is then controlled by the diffusion rate of $X^-$ ions through the NaX film to the nonreacted anode metal surface. This diffusion rate in turn is controlled electrochemically by several parameters well illucidated in the prior art including the external load resistance and impedance 32 and the cell internal resistance, a function of electrolyte film thickness and chemical composition, interelectrode spacing, substrate velocity and the like. The key to successful operation is as discussed above the NaX thin film which limits the rate of dissolution of sodium so that the energy released by the highly exothermic reaction can be extracted from the system as current in an external load rather than dissipated as heat. Coulombic efficiencies of close to 100 percent are obtainable if the reactor is operated to maximize this parameter.

A thin silicon or germanium film is formed at the cathode 10 in an exactly analogous fashion except that here the diffusion controlled rate limiting process is that of electrons through the product film (M) to the product-electrolyte interface.

Following this first plating operation, substrate 10 with a silicon or germanium doped layer is then fed to a second hopper 24 which is filled with a less highly doped electrolyte solution. The solution however is doped with the same type conductivity as the electrolyte draining from hopper 22. Reducing the solute concentration will achieve this less highly doped electrolyte. For example, if the electrolyte solution in hopper 22 is silicon tetrachloride and phosphoroustrichloride the electrolyte in hopper 24 should be a more dilute solution of the same components. The electrolyte is then coated on substrate 10 in an analogous manner to that previously described for the operation involving hopper 22. The substrate is then fed to a second metal anode 28 which when contacted with the substrate produces an analogous exothermic reaction and as described before, plating a less highly doped silicon or germanium layer onto the carrier.

The carrier 10 is then fed by roller 34 to suction apparatus 36. This suction apparatus 36 removes spent electrolyte containing NaX reaction product and recirculates it so that the alkali metal can be regenerated for further anode use. The substrate is then fed under apparatus 38 which is used to form a p-n junction. The apparatus operates to perform a diffusion or an implantation process which are techniques well-known in the art to provide opposite dopant to form a p-n junction.

The regeneration system will now be described. Anodes 16, 26 and 28 are connected with electrical contacts 40, 42 and 44 respectively through external load 32 to an electrode 46 inside regeneration reaction vessel 48. Brush electrical contacts 50, 52 and 54 contact the strip 10 beneath each anode thereby connecting the cathodes of the system to electrode 56 also housed within regeneration reaction vessel 48. spent electrolyte NaX is vacuumed off the strip 10 by suction apparatus 36 into regeneration reaction vessel 48. The enormous byproduct energy released from the deposition reaction can then be used to run a second deposition in the regeneration vessel 48 thereby plating out regenerated alkali metal on electrode 46. $X_2$ is liberated as a by product in this reaction and used in direct synthesis of new $MH_{4-n}X_n$ electrolyte or sold on the market.

For convenience, anode 16, which is part of the aluminum deposition reaction, has been shown as part of the regeneration system which includes anodes 26 and 28 from the elemental semiconductor deposition reactions. However, in practice $AlX_3$ which is present in the spent electrolyte formed from the aluminum deposition reaction should be separated out of the vacuum line so as not to be pumped to reaction vessel 48. If desired an entirely separate regeneration system, not shown, could be fabricated to regenerate the alkali metal of anode 16.

FIG. 2 shows the finished semiconductor matrix with substrate 10 which is coated with layer 58 of highly doped silicon or germanium metal which is further coated with a less highly doped layer 60 of silicon or germanium metal. A third layer 62 contains an opposite type conductivity to the doped layers 58 and 60. Electrical contacts such as illustrated by 64 can then be added to the top of the p-n junction to complete the semiconductor device.

As is well known to those of ordinary skill in the art, the oppositely doped layer 62 which forms the p-n junction may be applied by diffusion or ion implantation means.

One of the important uses of this semiconductor matrix is use in a solar cell. To complete the solar cell, a solar cell grid would be applied to the layer 62 and metallized continuously. Cells would then be cut to appropriate size, leads applied, and environmental protection applied by conventional means.

Due to the continuous process of the present invention large cells limited only by the initial substrate strip size can be fabricated to any length, greatly reducing cost per watt since few interconnections are required. Presently, conventional cells are three inches in diameter, and cells by 1982 are expected to be five inches in diameter which will require larger costs for interconnections for any meaningful power output.

What is claimed is:

1. A method for producing a semiconductor matrix having an electrically conductive cathode substrate comprising the steps of:
   (a) coating said substrate with a solution containing ions of a semiconductor element and an appropriate dopant;
   (b) contacting said solution with an alkali metal anode to produce a layer of doped elemental semiconductor on said cathode substrate, generation of alkali ions, and release of energy; and
   (c) forming a p-n junction by introducing to said elemental semiconductor layer an opposite type dopant.

2. The method of claim 1 further comprising the step of regenerating by electrodeposition the alkali metal of said alkali metal anode employing the said released energy.

3. A method for making a solar cell having front and rear electrodes composed of electrical contact materials comprising the steps of:
   (a) coating said rear electrode with a solution containing ions of a semiconductor element and which further contains an appropriate dopant;
   (b) depositing elemental semiconductor on said rear electrode form said solution by contacting said solution with an alkali anode to produce a layer of doped elemental semiconductor on said electrical contact, generation of alkali ions, and release of energy;
   (c) forming a p-n junction by introducing to said elemental semiconductor layer an opposite type dopant; and (d) placing the said front electrode on said p-n junction.

4. The method of making a solar cell of claim 3 further comprising the step of regenerating by electrodeposition the alkali metal of said alkali metal anode employing the said released energy.

5. A continuous method for producing a solar cell having front and rear electrodes comprising the steps of:
  (a) setting in motion a roll of material containing an electrical contact as the rear electrode;
  (b) coating said electrical contact on said moving material with a solution containing ions of a semiconductor element and which further contains an appropriate dopant;
  (c) contacting said solution on said moving material with an alkali metal anode to produce a layer of doped elemental semiconductor on said electrical contact, generation of alkali ions, and release of energy;
  (d) forming a p-n junction by introducing to said elemental semiconductor layer an opposite type dopant;
  (e) placing a second electrical contact onto said p-n junction to form the front electrode; and
  (f) cutting the moving material, electrical contact and p-n junction into an appropriate size for use as a solar cell.

* * * * *